(12) United States Patent
Roth et al.

(10) Patent No.: US 6,370,370 B1
(45) Date of Patent: Apr. 9, 2002

(54) METHOD FOR IMPROVING THE WANTED SIGNAL IN A RADIO RECEIVING UNIT

(76) Inventors: Sabine Roth, Obere Mühlen Str. 56, D-78087 Mönchweiler; Heinrich Schemmann, Danziger Str. 17, D-78052 Villingen-Schwenningen; Thomas Schwanenberger, Wacholderweg 2, D-78126 Königsfeld, all of (DE)

( * ) Notice: Subject to any disclaimer, the term of this patent is extended or adjusted under 35 U.S.C. 154(b) by 0 days.

(21) Appl. No.: 09/340,817

(22) Filed: Jun. 28, 1999

(30) Foreign Application Priority Data

Jul. 2, 1998 (DE) ......................................... 198 29 500

(51) Int. Cl.$^7$ ................................................. H04B 1/10
(52) U.S. Cl. ...................... 455/307; 455/226.2; 455/63; 375/346
(58) Field of Search ........................... 455/226.2, 250.1, 455/254, 62, 63, 245.1, 154.1, 283, 226.3, 307; 375/346

(56) References Cited

U.S. PATENT DOCUMENTS 5,001,776 A * 3/1991 Clark ......................... 455/226

FOREIGN PATENT DOCUMENTS

| DE | 2550176 A1 | 5/1976 | ............ H04B/1/10 |
| DE | 2914092 A1 | 10/1980 | ........... H04B/17/00 |
| DE | 68916899 T2 | 5/1990 | ............ H04B/1/66 |
| DE | 4006036 C2 | 1/1991 | ............ H03G/3/20 |
| DE | 4304819 C2 | 8/1994 | ............ H04B/1/18 |
| DE | 4319457 A1 | 12/1994 | ............ H04B/1/10 |
| EP | 0366485 A2 | 5/1990 | ............ H04B/1/10 |
| WO | WO 97/41643 | 11/1997 | ............ H04B/1/06 |

OTHER PUBLICATIONS

GermanSearch Report citing the above listed references (w/translation).

* cited by examiner

Primary Examiner—Daniel Hunter
Assistant Examiner—Nick Corsaro
(74) Attorney, Agent, or Firm—Joseph S. Tripoli; Harvey D. Fried; Joseph J. Kolodka

(57) ABSTRACT

It is known for a signal-strength detection unit to be used to detect the ratio of the input signal to the wanted signal obtained after it. A disadvantage in this case is that interference elements, which are also amplified, not only corrupt the output signal of the signal-strength detection unit, but can also adversely affect the quality of the wanted signal.

The invention is based on the object of providing a method for improving the wanted signal in the receiving unit of a communications system.

The method according to the invention for improving the wanted signal in a radio receiving unit having a channel filter, having a switch, having a control unit, having a signal-strength detection unit and having controllable amplifiers is distinguished in that the control unit drives the switch in such a manner that the switch alternately supplies a first signal upstream of the channel filter and a second signal downstream from the channel filter to the signal-strength detection unit, and that the output signal of the signal-strength detection unit is supplied to the control unit, and that the amplifiers are driven as a function of the output signal.

6 Claims, 6 Drawing Sheets

AS1 >> AS2

AS1 ≈ AS2

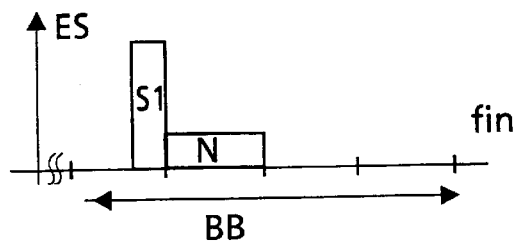
Fig. 2q
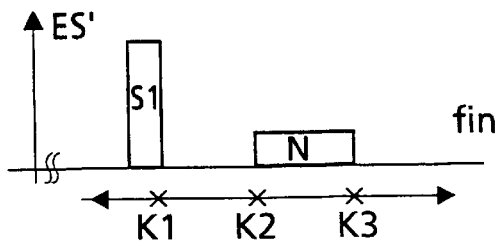
Fig. 2t
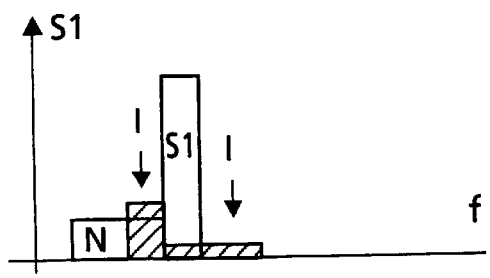
Fig. 2r
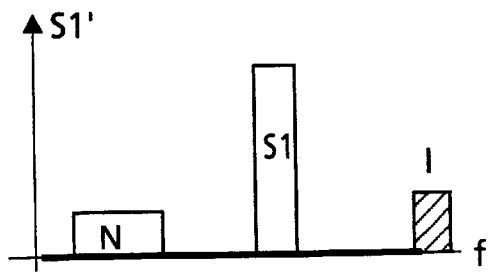
Fig. 2u
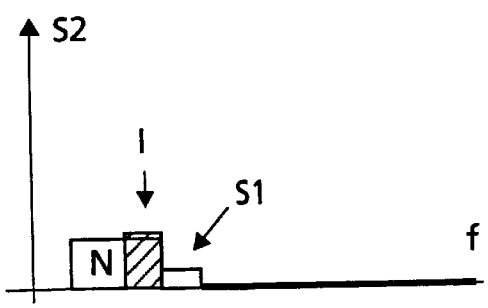
Fig. 2s
 -I
AS1 > AS2
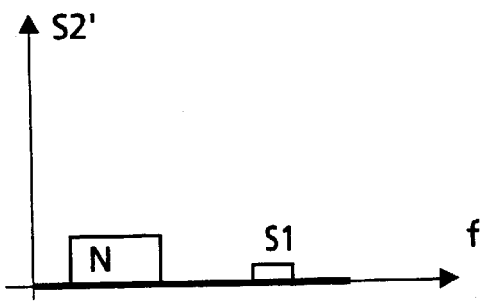
AS1' >> AS2'   Fig. 2v

METHOD FOR IMPROVING THE WANTED SIGNAL IN A RADIO RECEIVING UNIT

FIELD OF THE INVENTION

The invention is based on a method for improving the wanted signal in a radio receiving unit.

BACKGROUND OF THE INVENTION

It is known for a signal-strength detection unit to be used to detect the ratio of the input signal to the wanted signal obtained after it. A disadvantage in this case is that interference elements, which are also amplified, not only corrupt the output signal of the signal-strength detection unit, but can also adversely affect the quality of the wanted signal.

SUMMARY OF THE INVENTION

The invention is based on the object of providing a method for improving the wanted signal in a radio receiving unit. This object is achieved by the features of the invention specified in claim 1. Advantageous developments of the invention are specified in the dependent claims.

The method according to the invention for improving the wanted signal in a radio receiving unit having a channel filter, having a switch, having a control unit, having a signal-strength detection unit and having controllable amplifiers is distinguished in that the control unit drives the switch in such a manner that the switch alternately supplies a first signal upstream of the channel filter and a second signal downstream of the channel filter to the signal-strength detection unit, and that the output signal of the signal-strength detection unit, also referred to as the detector signal, is supplied to the control unit, and that the amplifiers are driven as a function of the two values of output signal.

There is a direct relationship between the output voltage and the wanted signal, which is intended to be improved. If the output signal is improved, the wanted signal is also improved. If the output voltage deteriorates, the wanted signal deteriorates.

By supplying the respective first and second signal to the signal-strength detection unit, and the comparison which is carried out with the aid of the control unit, the amplifiers are driven in such a manner that an improved wanted signal is obtained by using the method according to the invention.

The method is furthermore distinguished in that the first signal contains a wanted signal element and an interference signal element, and in that the interference signal element is filtered out by the channel filter.

Elimination of the interference signals by using the channel filter allows the signal strengths to be evaluated with or without an interference signal.

The method is also distinguished in that the first signal, upstream of the channel filter, is amplified by a first amplifier, and the second signal, downstream from the channel filter, is amplified by a second amplifier.

By using the amplifiers to amplify the respective signals, it is possible to carry out an optimization as a function of how the two detector signals turn out. The optimization is in this case carried out fully automatically by the control unit.

The method is also characterized in that the gain setting is optimized such that the ratio N/(S+R) of the wanted signal N to the interference signals S and the noise R is as high as possible.

Normally, the unit operates with high gain in the first amplifier, in order to keep receiver noise low. However, by means of the method according to the invention, it can be stated that, when the gain in the first amplifier is high and powerful interference signals are present, only a low ratio N/(S+R) is in consequence achieved. An improved output signal can be obtained if the gain of the first amplifier is reduced, and the gain of the second amplifier is increased.

The method is furthermore distinguished in that, if it is found by the control unit that the wanted signal is greater than the interference signals, maximum gain is set in the first amplifier, and a reduced gain is set in the second amplifier.

The method is also distinguished in that, if the ratio N/(S+R) of the output signal is low when the gain of the first amplifier is at a minimum and severe interference sources are present, the frequency range is changed.

If the output signal is still poor even with low gain in the first amplifier, the channel is changed in order in this way to improve the output signal by raising the wanted signal level in comparison with the interference source.

Instead of the switches which supply the different signals to the signal-strength detection unit, it is also possible to use two signal-strength detection units, which continuously supply both signals to the control unit.

BRIEF DESCRIPTION OF THE DRAWINGS

The invention will be explained in the following text with reference to the drawings. Identical reference symbols indicate identical functions. In the figures.

DETAILED DESCRIPTION OF PREFERRED EMBODIMENTS

Figure 1:
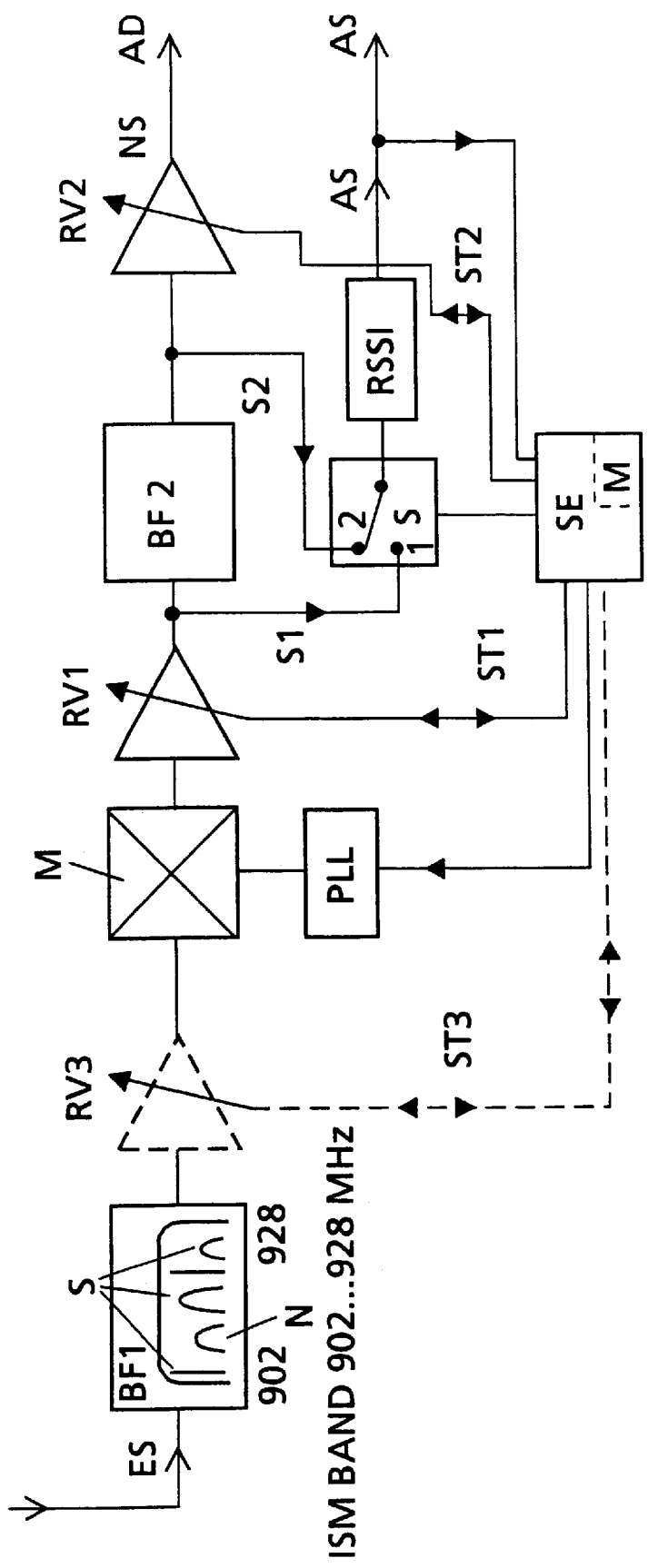
FIG. 1 shows a block diagram of the method according to the invention.

FIG. 1 shows a block diagram of the method according to the invention. The input signal ES passes via the first bandpass filter BF1, the mixer M, the first controllable amplifier RV1, and the second bandpass filter BF2 to the second controllable amplifier RV2, at whose output the wanted signal NS is present. The wanted signal NS is then supplied to an analogue/digital converter. A third controllable amplifier RV3 could also be arranged between the first bandpass filter BF1 and the mixer M. Since this is not absolutely essential, it is represented by dashed lines here. The controllable amplifier RV3 would be used for regulation improvement. The control unit SE contains a memory M. The memory is also represented by dashed lines, since this may be located outside the control unit SE. The control unit SE is furthermore connected to the first controllable amplifier RV1, to the PLL circuit (which is in turn connected to the mixer), to the switch S, to the second controllable amplifier RV2 and to the signal-strength detection unit RSSI. If a third controllable amplifier RV3 is used, it is also connected to the control unit. In a first switch position, the switch S passes a first signal S1 (upstream of the second bandpass filter BF2) to the signal-strength detection unit RSSI, and in a second switch position 2, it passes a second signal S2 (downstream from the second bandpass filter BF2) to the signal-strength detection unit RSSI.

A schematic curve which indicates the band range from 902 to 928 MHz is shown in the first bandpass filter BF1, to which the input signal ES is supplied. The band range comprises a number of reception channels. In this band range, the wanted signal is denoted by N, and interference signals by S. The input signal ES filtered in this way is then supplied to the mixer M. The mixer then mixes the signal with the signal from the PLL circuit, and passes this via the controllable amplifier VR1 on to the second bandpass filter BF2, which carries out the channel selection. The channel filter, for selecting the channel, is in this case configured as a bandpass filter. First of all, driven by the control unit SE, the switch S1 switches to the switch position 1, where the signal-strength detection unit RSSI is supplied with the first signal S1 upstream of the second bandpass filter BF and, later, to the switch position 2, where the second signal S2, downstream from the second filter BF2 is supplied to the signal-strength detection unit RSSI. The output signal AS of the signal-strength detection unit RSSI is also supplied to the control unit SE. Since the output signal AS is a voltage value, the term output voltage is used in the following text. Via the control lines ST1, ST2 and, if appropriate, ST3, the control unit can on the one hand set the controllable amplifiers RV1–RV3, and on the other hand knows the corresponding gain factors.

Figure 2A:
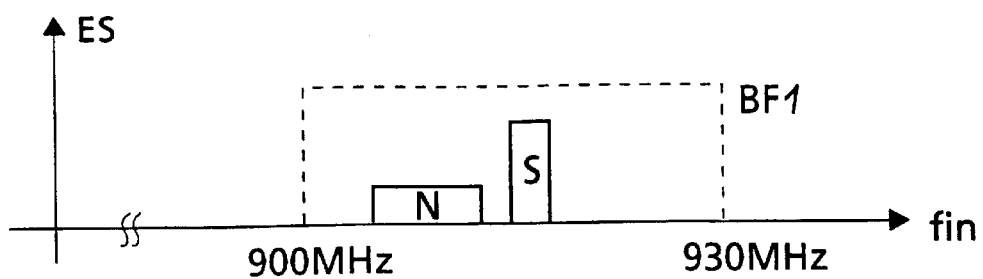
FIGS. 2 a–v show an illustration of curve profiles.
Figure 2B:
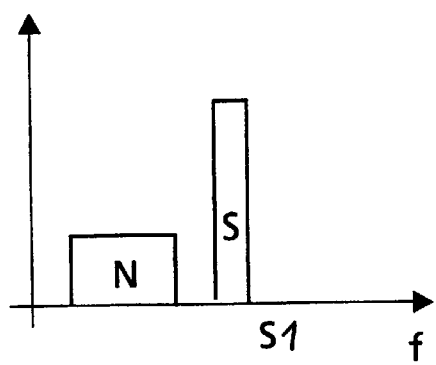
Figure 2C:
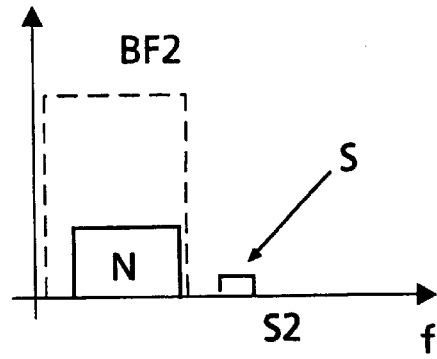
Figure 2D:
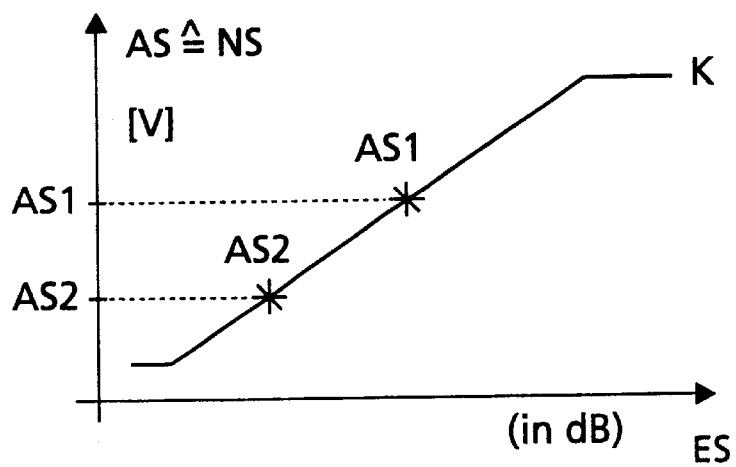

A method of operation of FIG. 1 will be explained with reference to the curve profiles in FIGS. 2a–v. FIGS. 2a–2d show the fundamental explanation of the measurement of the signal strengths. FIG. 2a shows the spectrum of the input signal ES as a function of the input frequency fin. The bandpass filter BF1 limits the band range of the ISM band (Industrial Scientific Medical) between 900 MHz and 930 MHz. There are a wanted signal M and an interference signal S in this band range. FIG. 2b shows a first spectrum S1, in which a wanted signal N and an interference signal S are shown. The interference signal S is greater than the wanted signal N. FIG. 2c shows a spectrum S2, in which a wanted signal N and a smaller interference signal S are shown. FIG. 2d shows the output voltage AS as a function of the signal strength of the input signal ES. There is a direct ratio between the output voltage AS and the wanted signal NS, and this ratio is intended to be improved. If the output signal AS is improved, the wanted signal NS is also improved. If the output signal AS deteriorates, the wanted signal deteriorates. The output voltages for the respective spectrum S1 from FIG. 2b and the spectrum S2 from FIG. 2c are denoted by AS1 and AS2, respectively.

The characteristic K indicates the characteristic profile of the signal-strength detection unit RSSI. The output voltage AS1 for the spectrum S1 from FIG. 2b was obtained upstream of the bandpass filter BF2. The output voltage AS2 for the spectrum S2 from FIG. 2c was obtained downstream from the bandpass filter BF2. The value by which the output voltage AS1 is greater than the output voltage AS2 is a measure of the strength of the interference signals in the adjacent channels.

Figure 2E:
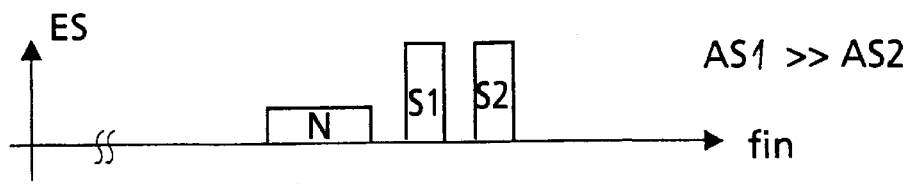
Figure 2F:
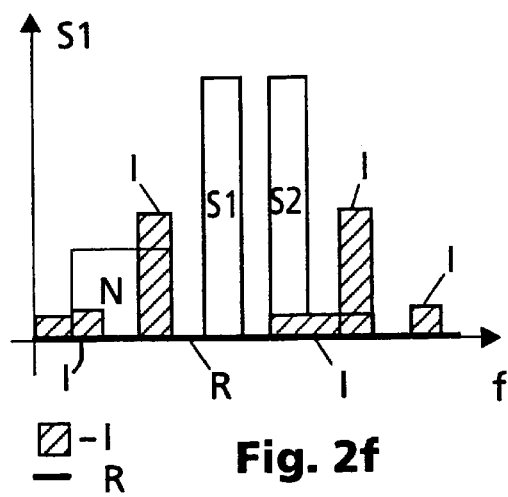
Figure 2H:
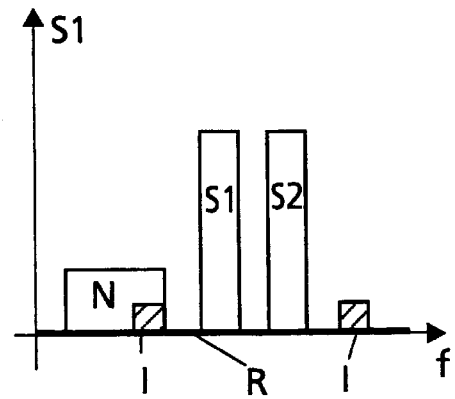
Figure 2G:
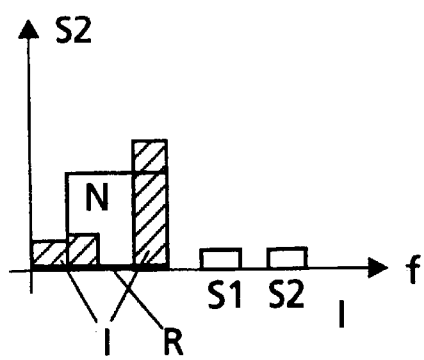

FIGS. 2e to 2i show the optimization of the gain setting for the situation in which a number of strong interference sources and a small wanted signal are present. FIG. 2e shows that two interference signals S1 and S2 are present, which are greater than the wanted signal N. FIG. 2f in turn shows the first spectrum S1 upstream of the bandpass filter BF2, in which case the intermodulation products I have been represented by dashed lines, and the basic noise has been denoted by R. FIG. 2g shows the second spectrum S2, which is obtained downstream from the bandpass filter BF2. It can be seen that the ratio N/(S+R+I) of the wanted signal N to the interference signal S, the basic noise R and the intermodulation product I has deteriorated.

Figure 2I:
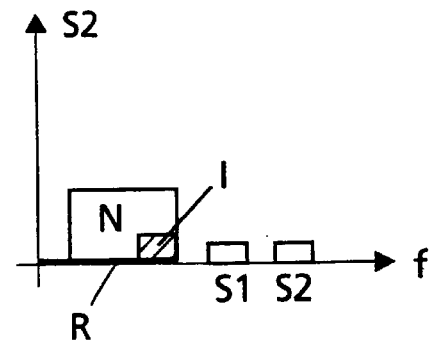

FIG. 2h shows the profile once the gain setting has been optimized, in such a manner that the first amplifier RV1 has produced less gain. The signal elements of the interference signal S1, S2 of the wanted signal N and the intermodulation product I have been reduced. However, if FIG. 2i is compared to FIG. 2g, it can be seen that the interference signal elements S1, S2 and the intermodulation products I have been reduced to a major extent, and the ratio N(S+R+I) is thus better. The output voltage AS1 of the signal-strength detection unit RSSI is considerably greater than the output voltage AS2. The optimum gain setting in this situation now differs in that a low gain was used first of all, followed by an increased gain. As can be seen in FIGS. 2f to 2i, this has improved the ratio N/(S+R+I).

Figure 2J:
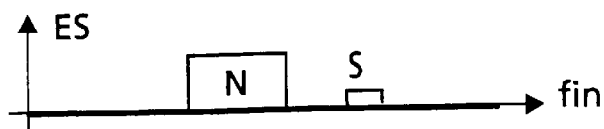
Figure 2K:
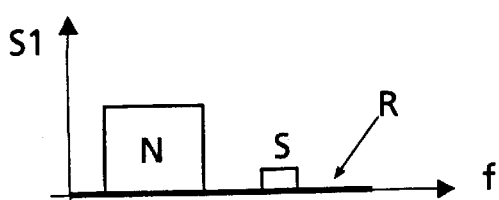
Figure 2N:
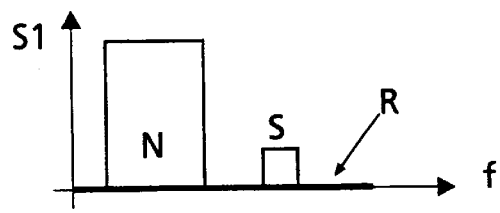
Figure 2L:
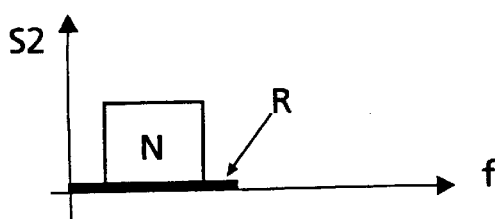
Figure 2O:
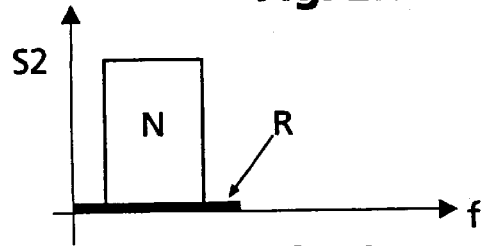
Figure 2M:
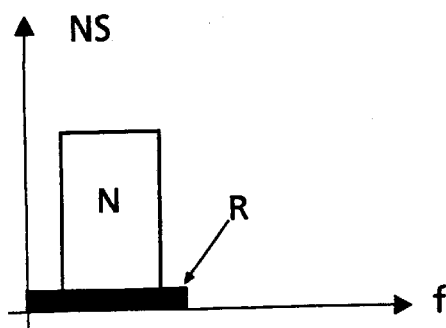
Figure 2P:
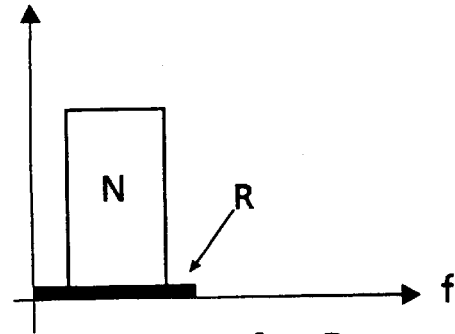

FIGS. 2j to 2p show a further situation for improving the gain setting. FIG. 2j shows a small wanted signal N and a very small interference signal S. FIG. 2k shows the spectrum S1 with normal gain. FIG. 2l shows the spectrum S2, in which it can be seen that this now includes only a basic noise R as the interference element, FIG. 2m shows that further amplification by the amplifier RV2 amplifies the wanted signal N as well as the basic noise R. FIG. 2n shows that the gain in the first amplifier RV1 is increased so that the wanted signal N is increased as well as the interference signal S. FIG. 2o shows that the bandpass filter BF1 has eliminated the interference signal S, and the wanted signal N is completely available. FIG. 2p shows that, with further amplification by the amplifier RV2, the wanted signal N as well as the basic noise R are now amplified, with the basic noise not having been amplified to the same extent as that illustrated in FIG. 2m, which was preceded by reduced amplification by the amplifier RV1. If a third amplifier RV3, which has been represented by dashed lines, is used in this case, the basic noise R can be reduced still further by maximum amplification by the amplifier RV3. This is feasible since the output voltage AS1 is approximately of the same magnitude as the output voltage AS2.

FIGS. 2q to 2v show a channel change, since strong interference signals are present in the vicinity. FIG. 2q shows the input signal ES as a function of the output frequency fin. The band region is indicated by BB. The interference signal S1 is located directly alongside the wanted signal N. In the first spectrum S1, it can be seen that a large proportion of intermodulation products I is scattered in the wanted signal N. The intermodulation product I is still present in the second spectrum S2. The interference source S1 is located directly alongside the wanted signal N. The output voltage AS1 is somewhat greater than the output voltage AS2 and, in this situation, we have a low gain factor for the amplifier RV1 upstream of the channel filter. FIG. 2t shows that a channel change has been carried out, so that the wanted signal N is further away from the interference signal S1. The different channels are denoted by K1 to K3. The amplifier RV1 is now set to a low gain, so that the wanted signal N, the interference signal S1 and the intermodulation product I do not become excessively great. The spectrum S1 in FIG. 2v shows that the wanted signal N is considerably greater than the interference signal S1, so that the output voltage AS1 is considerably greater than the output voltage AS2. It can clearly be seen here that the channel change has resulted in an improvement in the output voltage.

Figure 3:
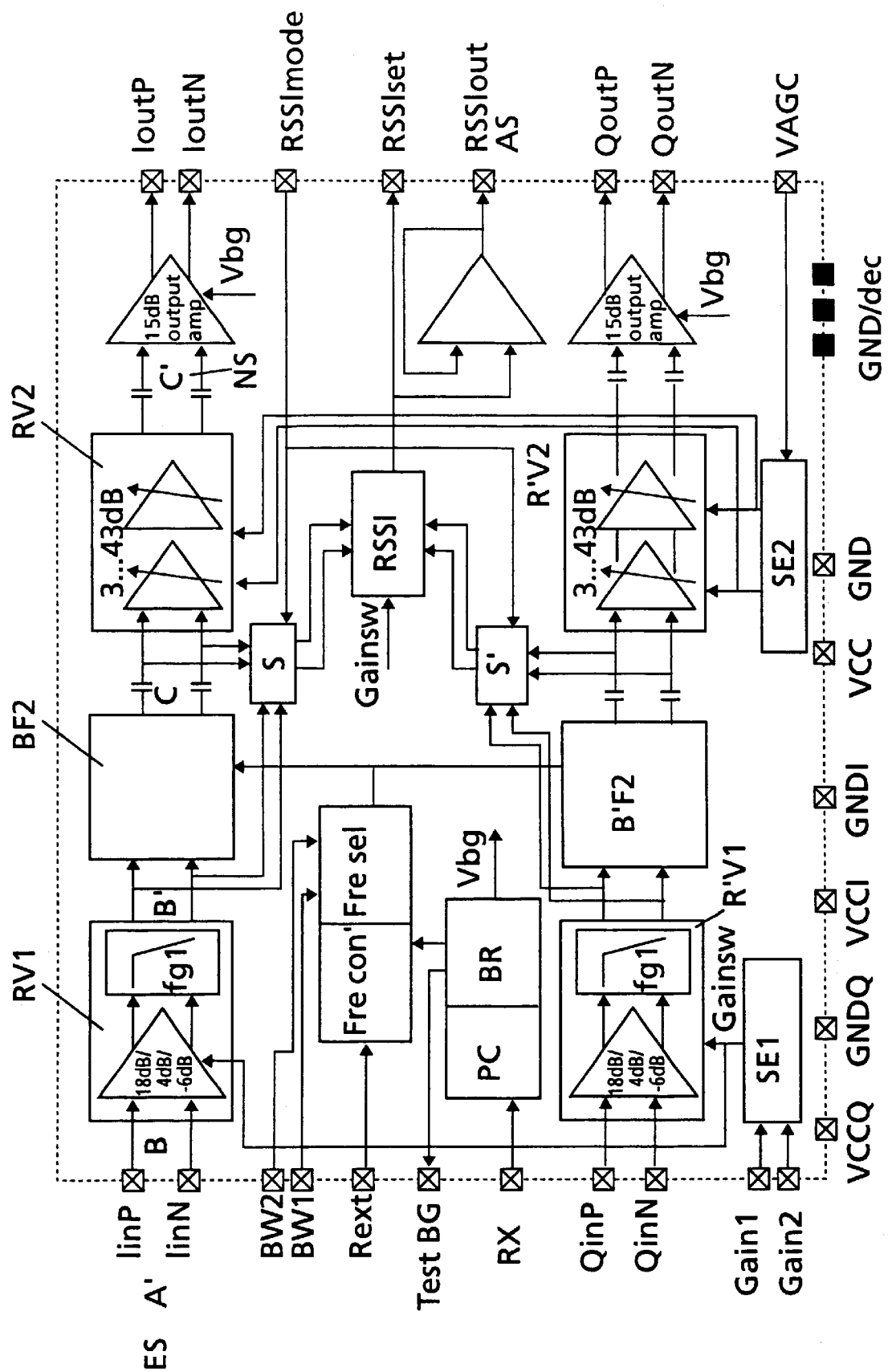
FIG. 3 shows a further block diagram of the method according to the invention.

FIG. 3 shows an implementation of the method illustrated in FIG. 1, in an analogue IC. Those components which are relevant for the invention are provided with the same component designation, and the method of operation is identical to that in the block diagram in FIG. 1. It can clearly be seen that the signal path is split in two, into an I channel and a Q channel. The method according to the invention can thus also be used for communications systems with quadrature modulation. The control unit is illustrated separately here, on the one hand and the gain control logic SE1 for the first control amplifier RV1 and R'V1 and a further control unit SE2, which drives the second controllable amplifier RV2 and a further, second controllable amplifier R'V2. The respective switches for S, S' then supply the signals to the signal-strength detection unit RSSI. The method of operation of this circuit corresponds to the function described in FIG. 1 and FIG. 2. The controllable amplifier RV3 and the mixer are not illustrated in this figure, and have not been taken into account. The first controllable amplifier RV1, R'V1 contain an amplifier and a first bandpass filter BF1. The second controllable amplifiers RV2, R'V2 are split into a number of amplifiers, in order to allow a greater gain variation range. The first controllable amplifiers RV1, R'V1 are designed in order to allow a gain of between −6 dB and +18 dB.

The first control unit SE1 is influenced by the gain factors Gain1 and Gain2, and the second control unit SE2 is influenced by the voltage VAGC. Part of the control unit is implemented in an IC, not shown here. This part drives the switch positions via RSSI mode, thus knows the switch position, and thus knows the present mode of the signal-strength detection unit RSSI, that is to say which measured value or output voltage is being detected at the moment. This part then evaluates the output voltage AS, and supplies the control voltages Gain1, Gain2, VAGC for gain setting.

What is claimed is:

1. Method for improving the wanted signal in a radio receiving unit having a channel filter (BF2), having a switch (S), having a control unit (SE), having a signal-strength detection unit (RSSI) and having controllable amplifiers (RV1, RV2), characterized in that the control unit drives the switch (S) in such a manner that the switch (S) alternately supplies a first signal (S1) upstream of the channel filter (BF2) and a second signal (S2) downstream from the channel filter (BF2) to the signal-strength detection unit (RSSI), and that the output signal of the signal-strength detection unit is supplied to the control unit, and that the amplifiers (RV1, RV2) are driven as a function of the output signal.

2. Method according to claim 1, characterized in that the first signal contains a wanted signal element and an interference signal element, and in that the interference signal element is filtered out by the channel filter.

3. Method according to claim 1, characterized in that the first signal, upstream of the channel filter, is amplified by a first amplifier, and the second signal, downstream from the channel filter, is amplified by a second amplifier.

4. Method according to claim 1, characterized in that, if the output signal is low when the first amplifier is at maximum gain, the gain of the first amplifier is reduced and the gain of the second amplifier is increased, and the output signal is improved in this way.

5. Method according to claim 1, characterized in that, if the output signal is at a maximum when the gain of the first amplifier is at a maximum, the amplification by the second amplifier is reduced.

6. Method according to claim 1, characterized in that, if the output signal is low when the first amplifier is at minimum gain, the frequency range is changed.

* * * * *